(12) United States Patent
Lin et al.

(10) Patent No.: US 11,781,904 B2
(45) Date of Patent: Oct. 10, 2023

(54) CHIP CHUCK FOR SUPPORTING LIGHT EMITTING CHIP UNDER OPTICAL INSPECTION AND CHIP SUPPORTING DEVICE HAVING THE SAME

(71) Applicant: MPI CORPORATION, Chu-Pei (TW)

(72) Inventors: Hung-I Lin, Chu-Pei (TW); Bo-Sian Lee, Chu-Pei (TW); Yi-Hung Chen, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 42 days.

(21) Appl. No.: 17/530,090

(22) Filed: Nov. 18, 2021

(65) Prior Publication Data

US 2022/0170781 A1 Jun. 2, 2022

Related U.S. Application Data

(60) Provisional application No. 63/119,662, filed on Dec. 1, 2020.

(30) Foreign Application Priority Data

May 6, 2021 (TW) .................................. 110116446

(51) Int. Cl.
*G01R 31/26* (2020.01)
*G01J 1/02* (2006.01)
*G01J 1/42* (2006.01)

(52) U.S. Cl.
CPC ........ *G01J 1/0223* (2013.01); *G01R 31/2635* (2013.01); *G01J 2001/4252* (2013.01)

(58) Field of Classification Search
CPC ...... G01J 1/0223; G01J 1/0252; G01J 1/0403; G01J 2001/4252; G01R 1/0466;
(Continued)

(56) References Cited

U.S. PATENT DOCUMENTS 5,498,973 A * 3/1996 Cavaliere .............. H01S 5/4025
324/750.2
6,501,260 B1 * 12/2002 Hu ........................ H01S 5/0014
324/750.2
(Continued)

FOREIGN PATENT DOCUMENTS

KR 20-0386172 Y1 6/2005
TW I413759 B 11/2013

*Primary Examiner* — Vinh P Nguyen
(74) *Attorney, Agent, or Firm* — Birch, Stewart, Kolasch & Birch, LLP

(57) ABSTRACT

A chip chuck includes front and back slopes obliquely extending toward a bottom surface from front and back edges of a top surface having a chip placement area for supporting a chip under test, and is defined with an imaginary vertical reference line perpendicular to the chip placement area and an imaginary horizontal reference line. The front and back slopes are connected with the chip placement area and each provided with an included acute angle with respect to the imaginary horizontal reference line, thereby avoiding interference with light emitted from the chip. A chip supporting device includes a chip chuck, and an optical sensing module fixed relative thereto and including an optical sensor whose light receiving surface faces toward a back light emitting surface of the chip, thereby enabling optical characteristic inspection of front and back light emitting surfaces of the chip at the same time.

16 Claims, 14 Drawing Sheets

(58) Field of Classification Search
CPC ............... G01R 31/2635; G01R 33/26; G01R 31/2884; G01R 31/311; G01R 31/44; G01R 1/0735; G02B 6/0073; G02B 27/0172; G02B 6/0023; G02B 19/0066; G02B 23/2469; G02B 27/0101; G02B 5/0294; G02B 6/0021; G02B 19/0061; G02B 27/017; G02B 5/1814; G02B 6/0046; G02B 6/425; G05B 19/414; G02F 1/133603; G02F 1/13318; G02F 1/15; G02F 1/1335; G02F 1/133612; G02F 1/155; G02F 1/1533; G02F 1/0121; G02F 1/161; G02F 1/133607; G02F 1/133606; G02F 1/1303; G02F 1/133308; F21V 19/00

See application file for complete search history.

(56) References Cited

U.S. PATENT DOCUMENTS

| | | | |
|---|---|---|---|
| 7,449,905 B2 * | 11/2008 | Shi | H01S 5/02423 324/750.2 |
| 8,421,104 B2 * | 4/2013 | Kuo | H01L 33/50 257/E33.068 |
| 9,439,617 B2 * | 9/2016 | Flohr | A61B 6/4233 |
| 9,874,597 B2 * | 1/2018 | McCord | G01R 31/2635 |

* cited by examiner

CHIP CHUCK FOR SUPPORTING LIGHT EMITTING CHIP UNDER OPTICAL INSPECTION AND CHIP SUPPORTING DEVICE HAVING THE SAME

CROSS REFERENCE TO RELATED APPLICATIONS

This non-provisional application claims the benefit under 35 U.S.C. § 119(e) to U.S. Provisional Application No. 63/119,662, filed on Dec. 1, 2020, and under 35 U.S.C. § 119(a) to patent application Ser. No. 11/011,6446, filed in Taiwan on May 6, 2021, all of which are hereby expressly incorporated by reference into the present application.

BACKGROUND OF THE INVENTION

1. Field of the Invention

The present invention relates generally to optical inspection equipment for light emitting chips and more particularly, to a chip chuck for optical inspection, and a chip supporting device including the chip chuck.

2. Description of the Related Art

Referring to FIG. 1, a light emitting chip 10 (hereinafter also referred to "chip under test") is shown. The light emitting chip 10 is provided on a top surface 11 or a bottom surface 12 thereof with conductive contacts (not shown), or may be provided on both the top and bottom surfaces 11 and 12 with conductive contacts. When the conductive contacts are electrified, the light emitting chip 10 emits light from two sides thereof, thereby having two opposite lateral light emitting surfaces. That means a front light emitting surface 13 (front facet) and a back light emitting surface 14 (back facet) of the light emitting chip 10 both emit light. The scope of luminescence is shown by imaginary lines in FIG. 1. When being inspected, the light emitting chip 10 is usually disposed on a turntable (not shown) including a plurality of chip supporting devices. That means a plurality of light emitting chips 10 are respectively disposed on the chip supporting devices at the same time. The turntable turns the light emitting chips 10 to an inspection position one by one, which is located correspondingly to a fixed optical sensor (not shown), such as an integrating sphere, so that the light emitting chips 10 are sensed by the optical sensor at the inspection position for optical inspection one by one.

However, when the light emitting chip 10 is located at the inspection position, the front light emitting surface 13 of the light emitting chip 10 faces toward the optical sensor. Therefore, only the optical characteristics of the front light emitting surface 13 can be inspected, but the optical characteristics of the back light emitting surface 14 can't be inspected. Besides, the divergent angle θ of the light emitted by the light emitting chip 10 may be ranged from ±15° to ±75°. The larger the divergent angle θ, the more the interference between the light and the chip supporting device, and the less accurate the inspection results of the optical characteristics. In addition, the light emitting chip 10 may undergo optical characteristic inspection under specific temperature conditions, but the conventional chip supporting devices can't satisfy such test requirement.

SUMMARY OF THE INVENTION

The present invention has been accomplished in view of the above-noted circumstances. It is an objective of the present invention to provide a chip chuck for optical inspection, which can avoid interference with light emitted by a chip under test.

To attain the above objective, the present invention provides a chip chuck for optical inspection, which includes a top surface, a bottom surface opposite to the top surface, a front slope obliquely extending from a front edge of the top surface toward the bottom surface, and a back slope obliquely extending from a back edge of the top surface opposite to the front edge toward the bottom surface. The top surface has a chip placement area for supporting a light emitting chip under test capable of emitting light. The chip chuck is defined with an imaginary vertical reference line perpendicular to the top surface in the chip placement area, and an imaginary horizontal reference line perpendicular to the imaginary vertical reference line. The front slope and the back slope are connected with the chip placement area and each provided with an included angle smaller than 90 degrees with respect to the imaginary horizontal reference line.

With the above-mentioned structural features, the front and back slopes of the chip chuck face toward the front and the back respectively. The chip under test can be disposed in the chip placement area of the top surface of the chip chuck in a way that the front and back light emitting surfaces, i.e. two opposite lateral light emitting surfaces, faces toward the front and the back respectively, for two optical sensors facing toward the front and back slopes of the chip chuck respectively to receive the light emitted by the front and back light emitting surfaces of the chip under test, so that the optical characteristics of the front and back light emitting surfaces can be inspected. Resulted from the shape design with the front and back slopes, the chip chuck can avoid obstructing the light. Besides, as long as the included angles between the front and back slopes and the imaginary horizontal reference line are equal to or a little larger than the divergent angle of the light emitted by the chip under test or at least one of the front and back slopes is provided with a groove connected with the chip placement area of the top surface for the partial light to pass through the groove to completely prevent the light from interference with the chip chuck, the light emitted by the front and back light emitting surfaces of the chip under test can be completely received by the optical sensors, so as to bring accurate inspection results. In addition, resulted from the shape design with the front and back slopes, the chip chuck is approximately taper-shaped, thereby stable in structure and having so much volume as to achieve great heat conducting effect when heat conduction is required.

It is another objective of the present invention to provide a chip supporting device, which enables the optical characteristic inspection of the front and back light emitting surfaces, i.e., two opposite lateral light emitting surfaces, of a chip under test at the same time.

To attain the above objective, the present invention provides a chip supporting device which includes a chip chuck and an optical sensing module fixed relative to the chip chuck. The chip chuck includes a top surface for supporting a chip under test. The optical sensing module includes an optical sensor. The optical sensor has a light receiving surface. The light receiving surface is adapted to face toward a lateral light emitting surface of the chip under test disposed on the chip chuck. For example, the chip chuck may, but unlimited to, be the above-described chip chuck, and the light receiving surface of the optical sensor faces toward the back slope of the chip chuck so as to face toward the lateral light emitting surface, i.e., the back light emitting surface, of the chip under test.

As a result, the chip supporting device can be applied to a turntable similar to that mentioned in the description of the related art, so that the chip under test located on the top surface of the chip chuck can be shipped by the turntable to an inspection position for another optical sensor located at a fixed position outside the chip supporting device to receive the light emitted by another lateral light emitting surface of the chip under test, i.e. the front light emitting surface, for the optical characteristic inspection. The optical sensor included in the chip supporting device is rotated along with the turntable. Therefore, when the optical characteristic inspection is performed to the front light emitting surface of the chip under test, the optical sensor of the chip supporting device can receive the light emitted by the back light emitting surface of the chip under test for the optical characteristic inspection.

It is still another objective of the present invention to provide a chip supporting device, which enables the optical characteristic inspection of a chip under test under specific temperature conditions.

To attain the above objective, the aforementioned chip supporting device may further include a temperature controller. The chip chuck is disposed on the temperature controller in a way that the chip chuck is adjustable in temperature by the temperature controller. For example, the temperature controller may be a thermoelectric cooler, which is also referred to as 'TEC', for lowering the temperature of the chip chuck, so as to cool down the chip under test located on the top surface of the chip chuck and maintain its temperature at a specific low temperature required for the optical characteristic inspection. The temperature controller may be disposed on a heat sink, so that the heat of a heat emitting surface of the temperature controller can be dissipated by the heat sink and thereby the temperature controller can achieve great cooling efficiency. Alternatively, the temperature controller may be a heater for raising the temperature of the chip chuck, so as to heat up the chip under test located on the top surface of the chip chuck and maintain its temperature at a specific high temperature required for the optical characteristic inspection.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
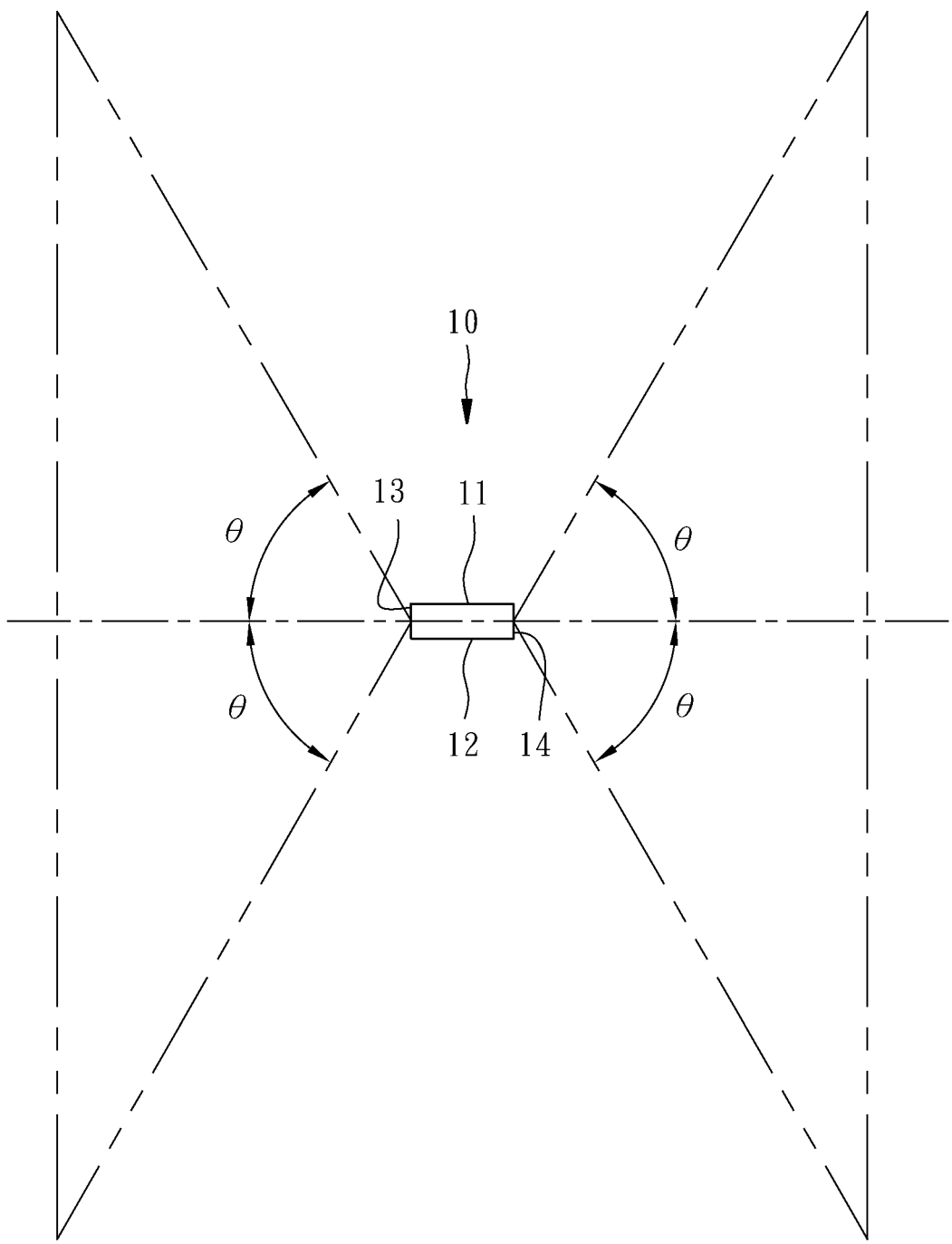
FIG. 1 is a schematic side view of a chip under test.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 2:
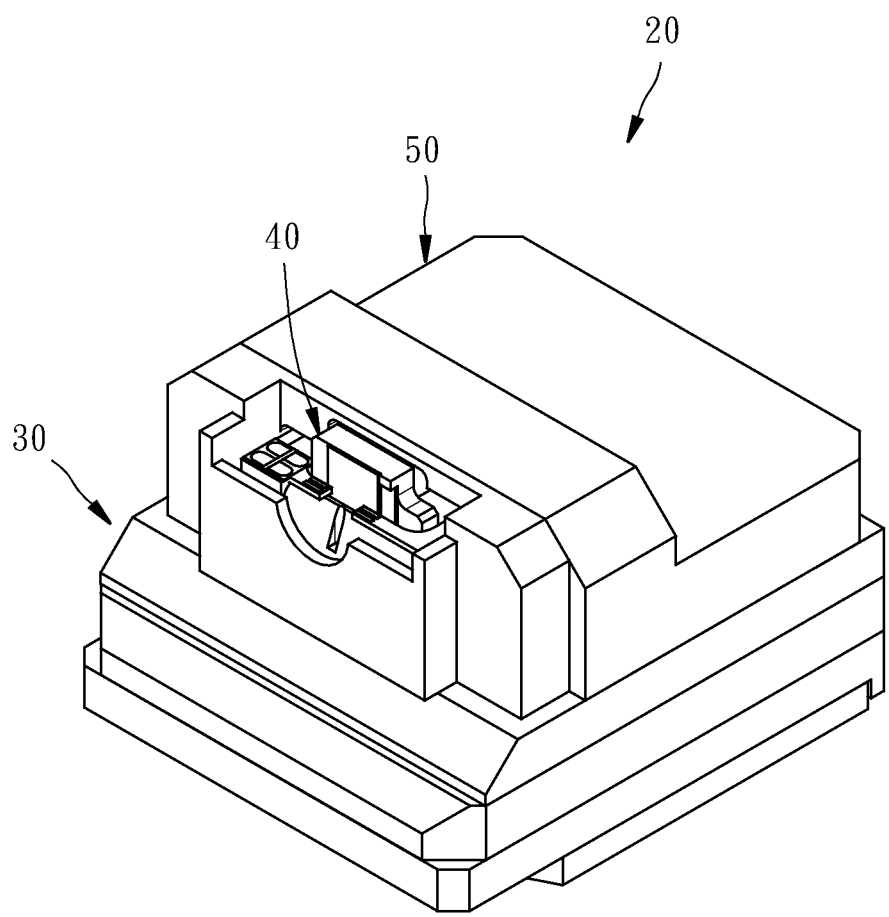
FIG. 2 is an assembled perspective view of a chip supporting device according to a preferred embodiment of the present invention.
Figure 2:
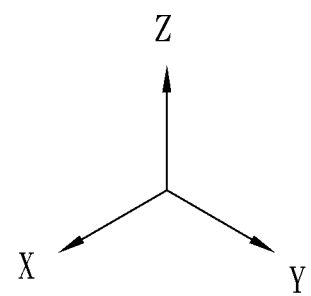

Referring to FIG. 2, a chip supporting device 20 according to a preferred embodiment of the present invention includes a supporting module 30, an optical sensing module 40, and a shield 50.

It should be firstly mentioned here that the directional terms mentioned hereinafter are based on the direction shown in FIG. 2. For example, the term 'downward' or 'below' refers to the negative direction of Z-axis, the term 'frontward' or 'the front' refers to the positive direction of X-axis, the term 'backward' or 'the back' refers to the negative direction of X-axis, and so on.

Figure 3:
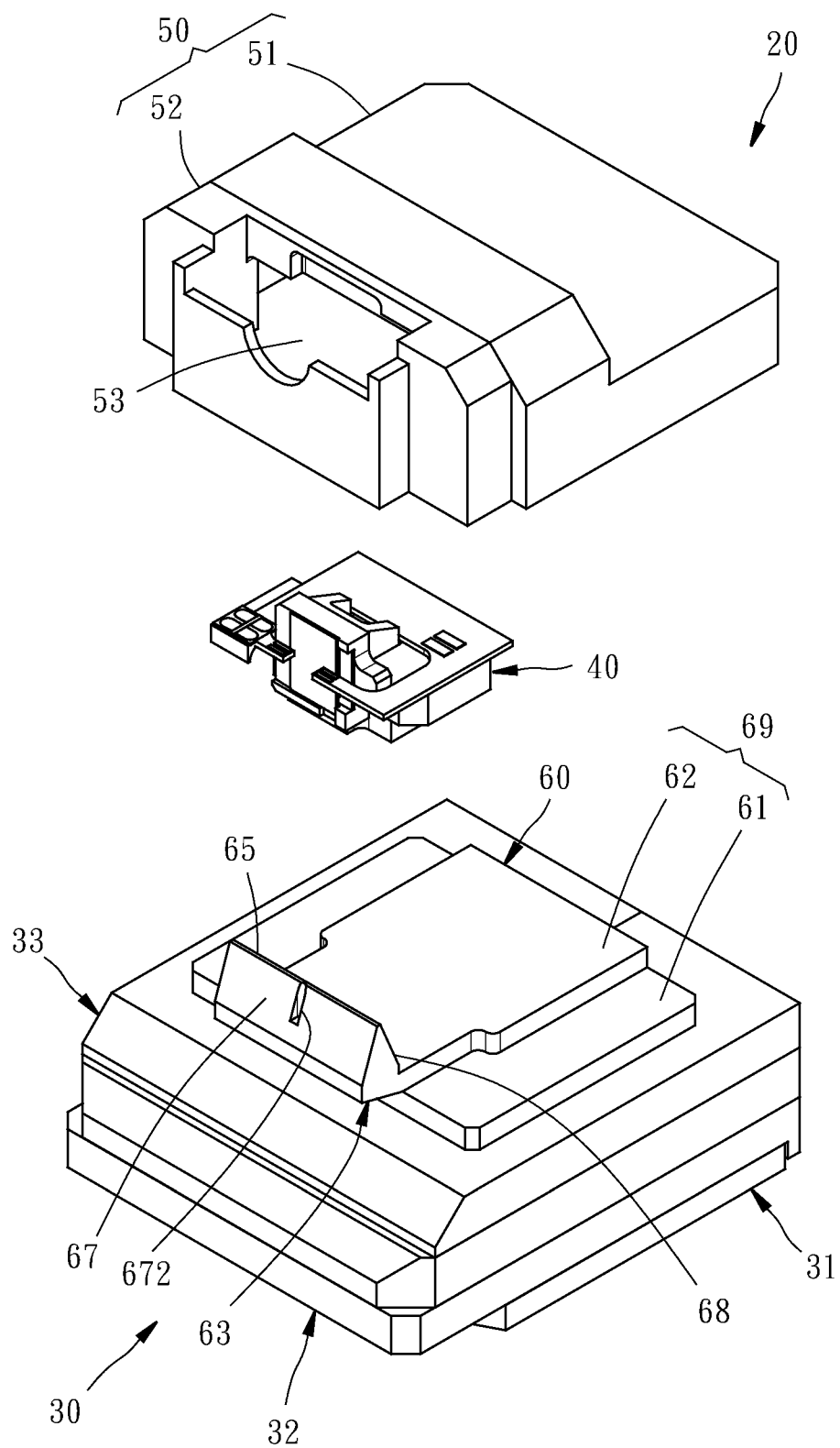
FIG. 3 is an exploded perspective view of the chip supporting device.

Referring to FIG. 3, the supporting module 30 includes a base 31, a heat sink 32 disposed on the top surface of the base 31, a temperature controller 33 disposed on the top surface of the heat sink 32, and a chip chuck 60 disposed on the top surface of the temperature controller 33. The base 31 is less related to the technical features of the present invention, thereby represented by only a plate in the figures.

Figure 4:
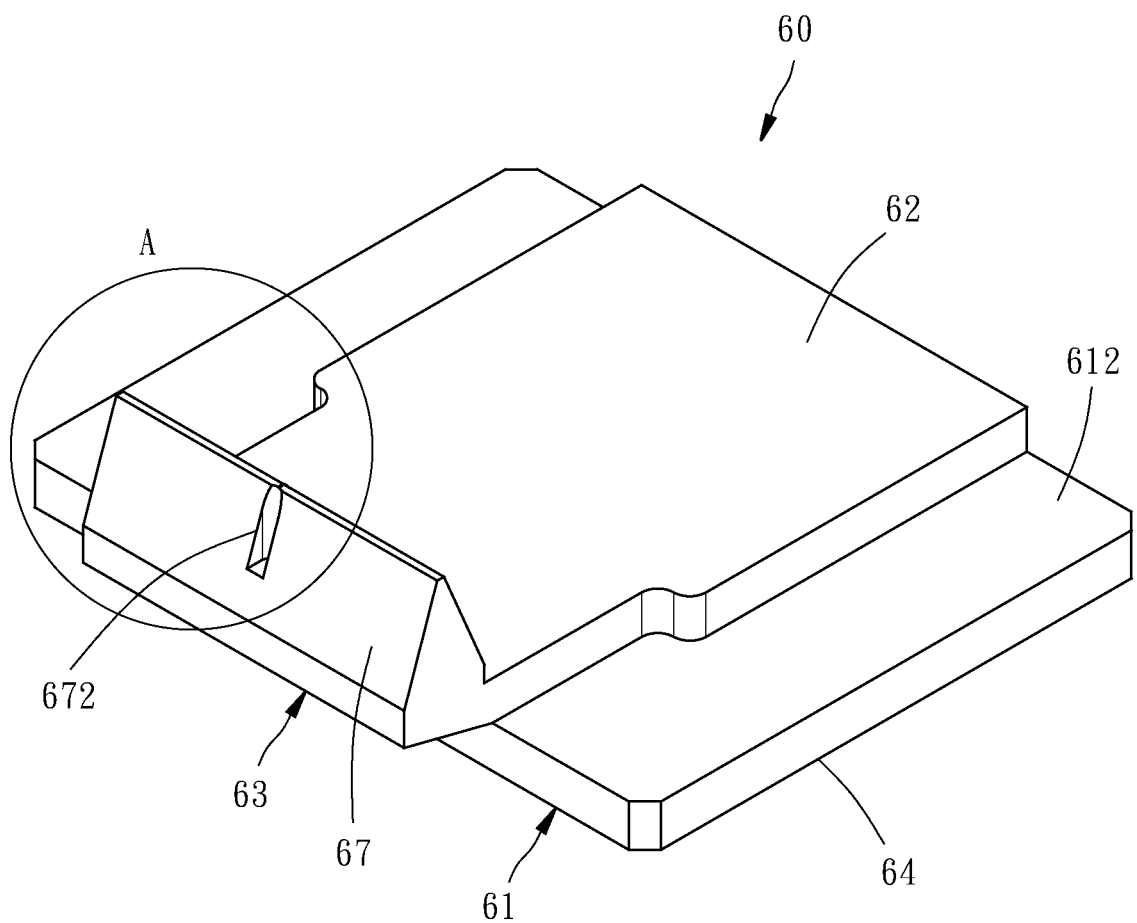
FIG. 4 is a perspective view of a chip chuck of the chip supporting device.
Figure 5:
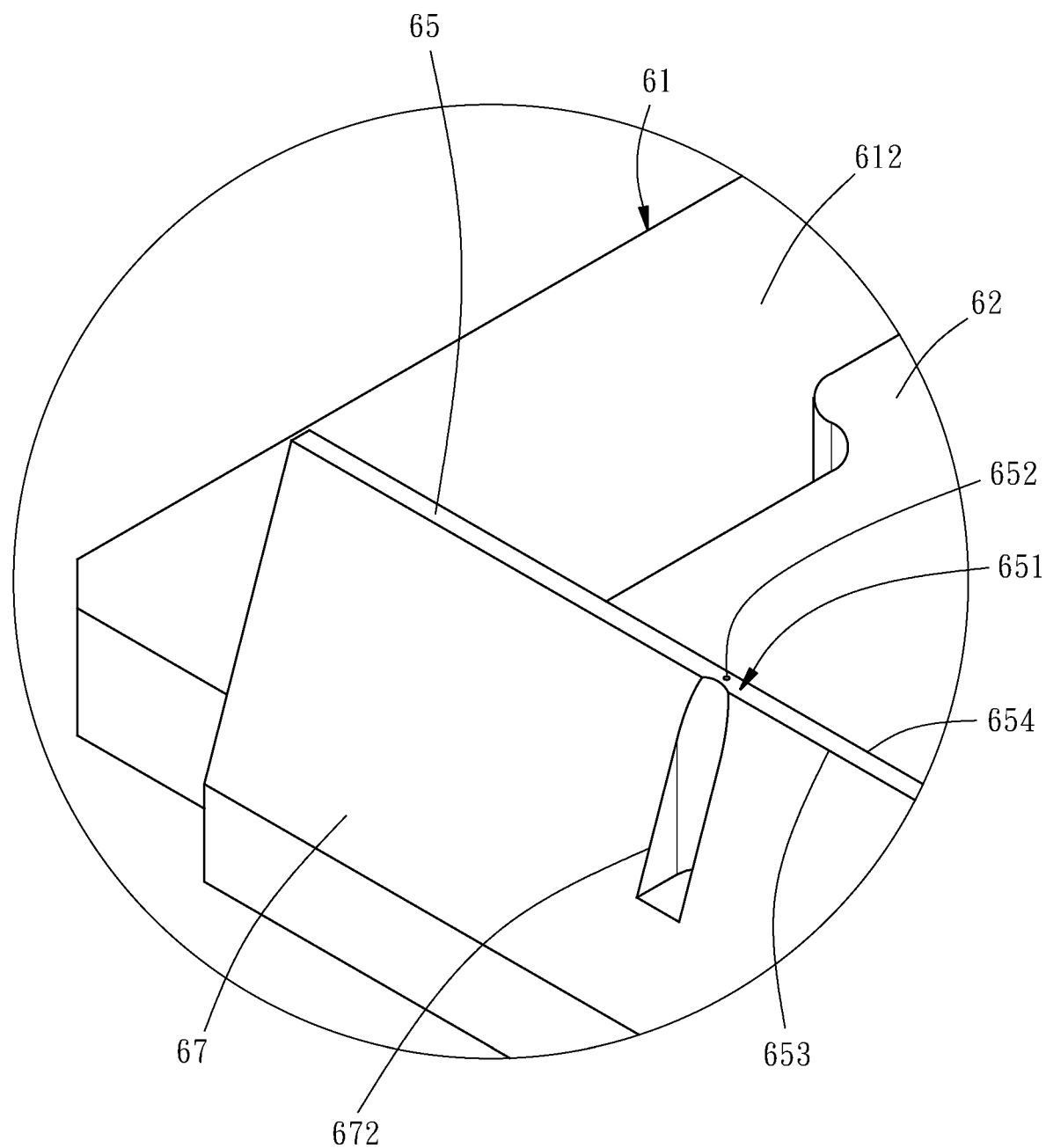
FIG. 5 is an enlarged view of the part A in FIG. 4.
Figure 6:
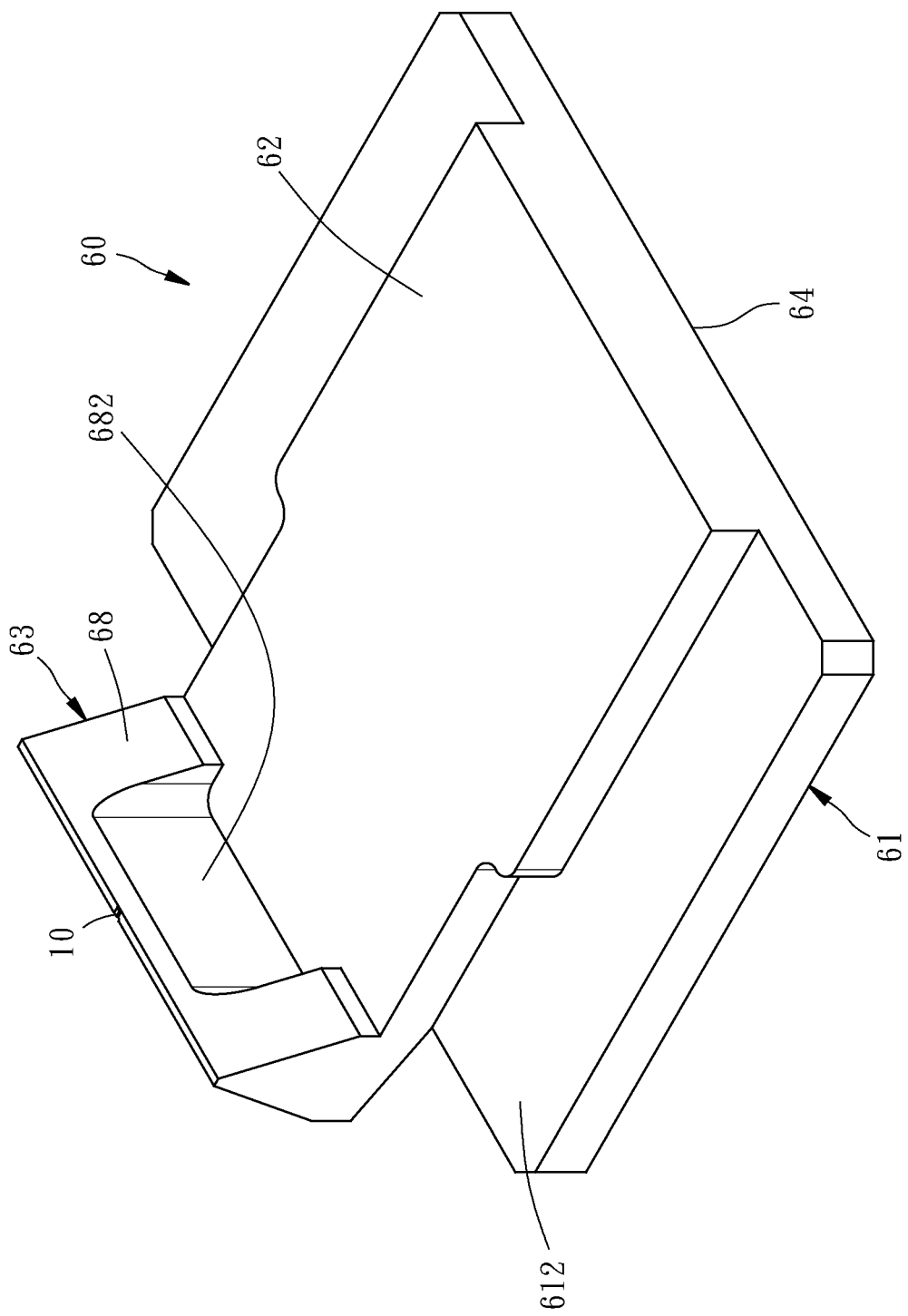
FIG. 6 is a perspective view of the chip chuck and a chip under test.

Referring to FIG. 4 to FIG. 6, the chip chuck 60 includes a bottom plate portion 61 approximately shaped as a rectangular plate, a top plate portion 62 integrally connected to a top surface 612 of the bottom plate portion 61 and shaped as a plate relatively smaller in area, and a supporting portion 63 upwardly and monolithically extending from the front side of the top plate portion 62. A bottom surface 64 of the chip chuck 60, i.e., the bottom surface of the bottom plate portion 61, is fixed to the top surface of the temperature controller 33. The supporting portion 63 is approximately shaped as an elongated square pyramid, but the top thereof has an elongated rectangular top surface 65 instead of a point of pyramid. The top surface 65 is provided at the center thereof with a chip placement area 651 for supporting a light emitting chip 10 capable of emitting light, like the light emitting chip 10 shown in FIG. 1. In this embodiment, the top surface 65 is provided with a vacuum suction hole 652 located in the chip placement area 651. The vacuum suction hole 652 can communicate with a vacuum source (not shown) through a passage 66 provided inside the chip chuck 60 as shown in FIG. 7, thereby resulted by the vacuum source to generate negative pressure to attach the light emitting chip 10 under test on the top surface 65 by vacuum suction for preventing the light emitting chip 10 under test from falling from the top surface 65.

Figure 7:
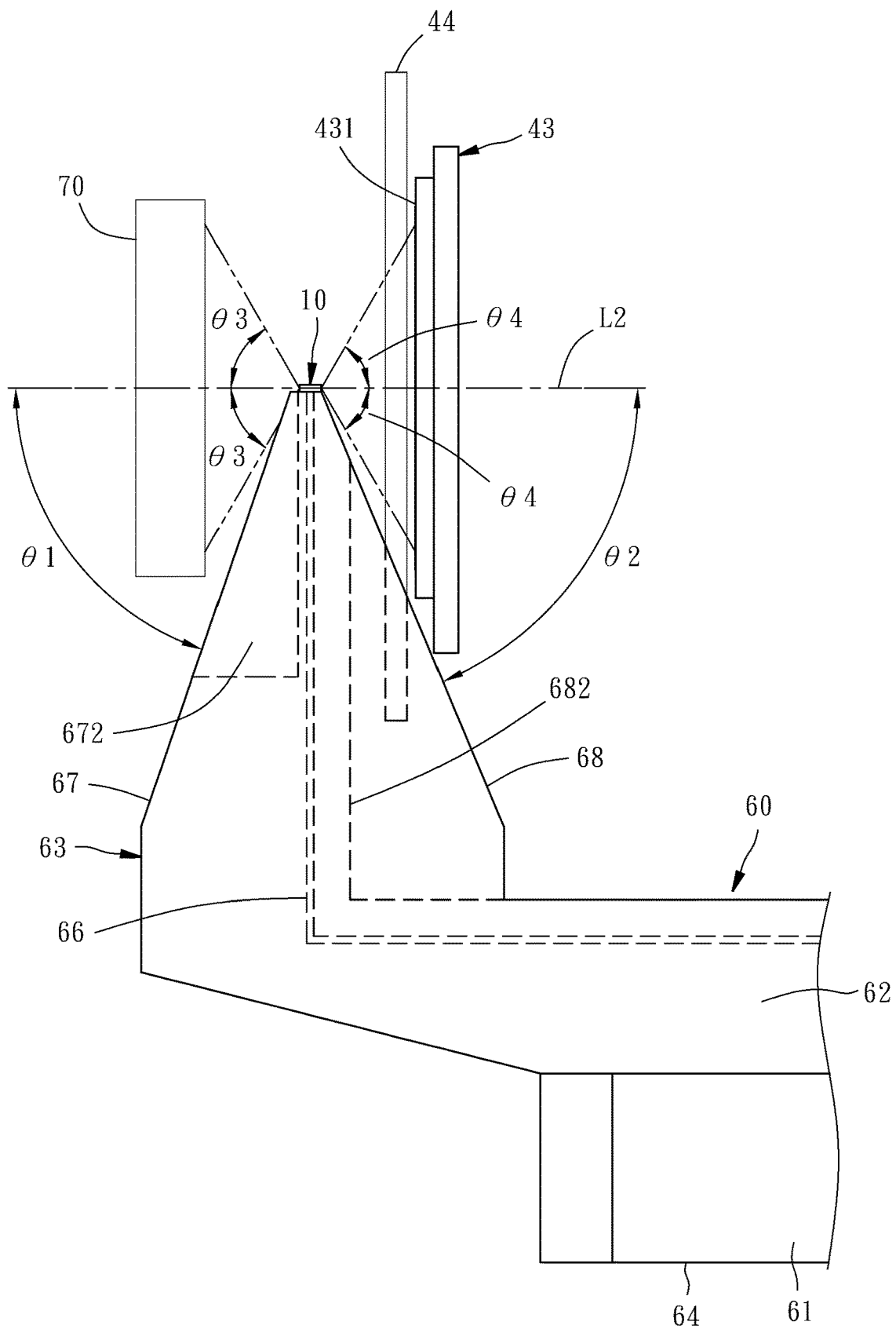
FIG. 7 is a schematic side view showing the chip chuck, the chip under test, an optical sensor and a light transmissible guard plate of an optical sensing module, and an integrating sphere.
Figure 10:
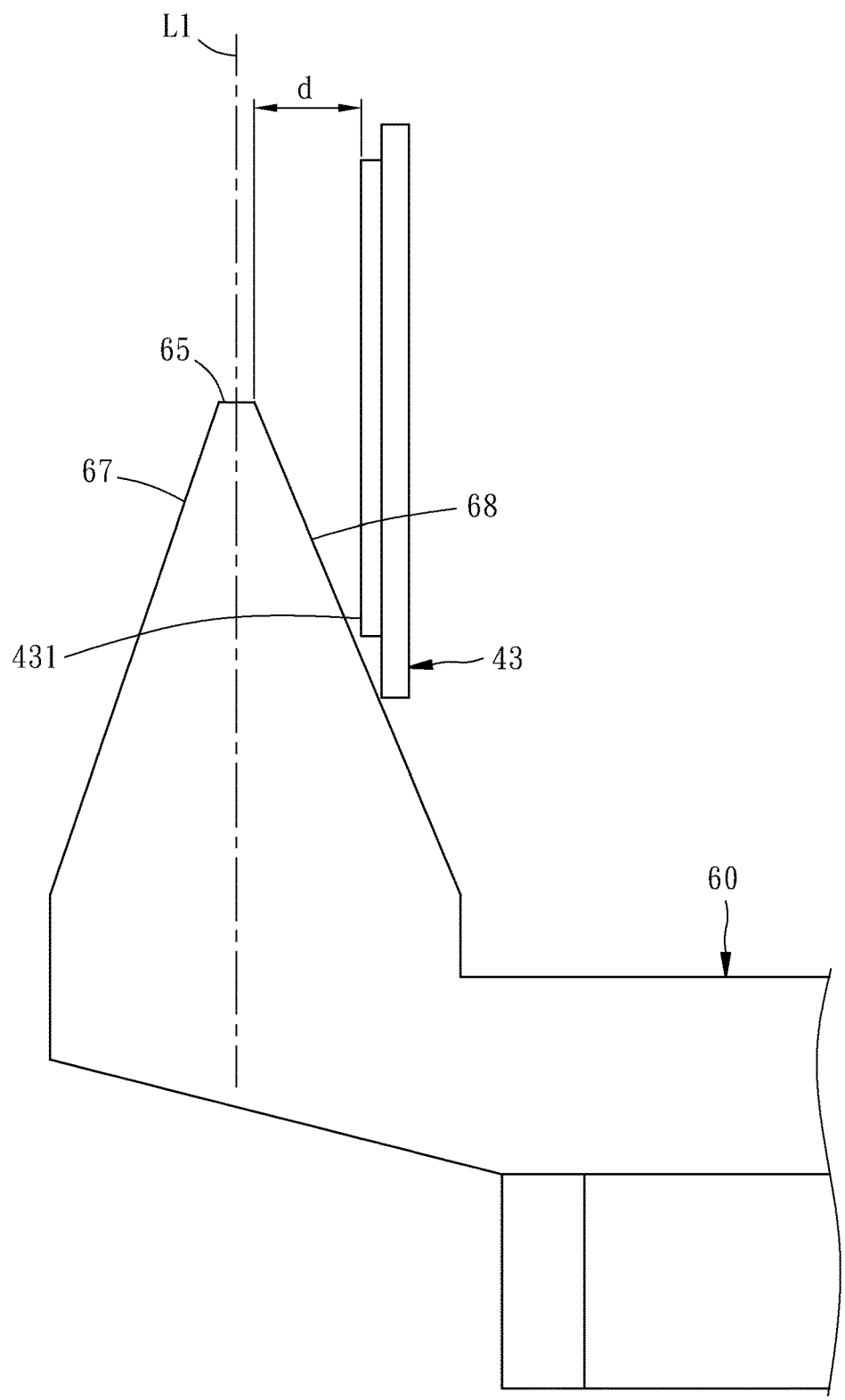
FIG. 10 is a side view of the chip chuck and the optical sensor of the optical sensing module.

Referring to FIG. 5 to FIG. 7, two long edges of the top surface 65 of the supporting portion 63 are defined as a front edge 653 and a back edge 654, respectively. The supporting portion 63 further has a front slope 67 obliquely extending toward the bottom surface 64 (i.e., obliquely extending downward) from the front edge 653 of the top surface 65, and a back slope 68 obliquely extending toward the bottom surface 64 from the back edge 654 of the top surface 65. That means the front and back slopes 67 and 68 face toward the front and the back, respectively. Specifically speaking, the chip chuck 60 is defined with an imaginary vertical reference line L1 perpendicular to the top surface 65 as shown in FIG. 10, and an imaginary horizontal reference line L2 perpendicular to the imaginary vertical reference line L1 as shown in FIG. 7. In this embodiment, the top surface 65 is parallel to X-Y plane. The imaginary vertical reference line L1 is parallel to Z-axis, thereby extending upward and downward. The imaginary horizontal reference line L2 is parallel to X-axis, thereby extending frontward and backward. The front slope 67 extends downward and deflects to the front, thereby provided with an included angle θ1 smaller than 90 degrees with respect to the imaginary horizontal reference line L2. The back slope 68 extends downward and deflects to the back toward the top plate portion 62, so the back slope 68 is also provided with an included angle θ2 smaller than 90 degrees with respect to the imaginary horizontal reference line L2. It is to be mentioned that in the condition that the top surface 65 is not completely a plane, the imaginary vertical reference line L1 is defined in the chip placement area 651, which means the imaginary vertical reference line L1 is a normal to the top surface 65 in the chip placement area 651.

Figure 8A:
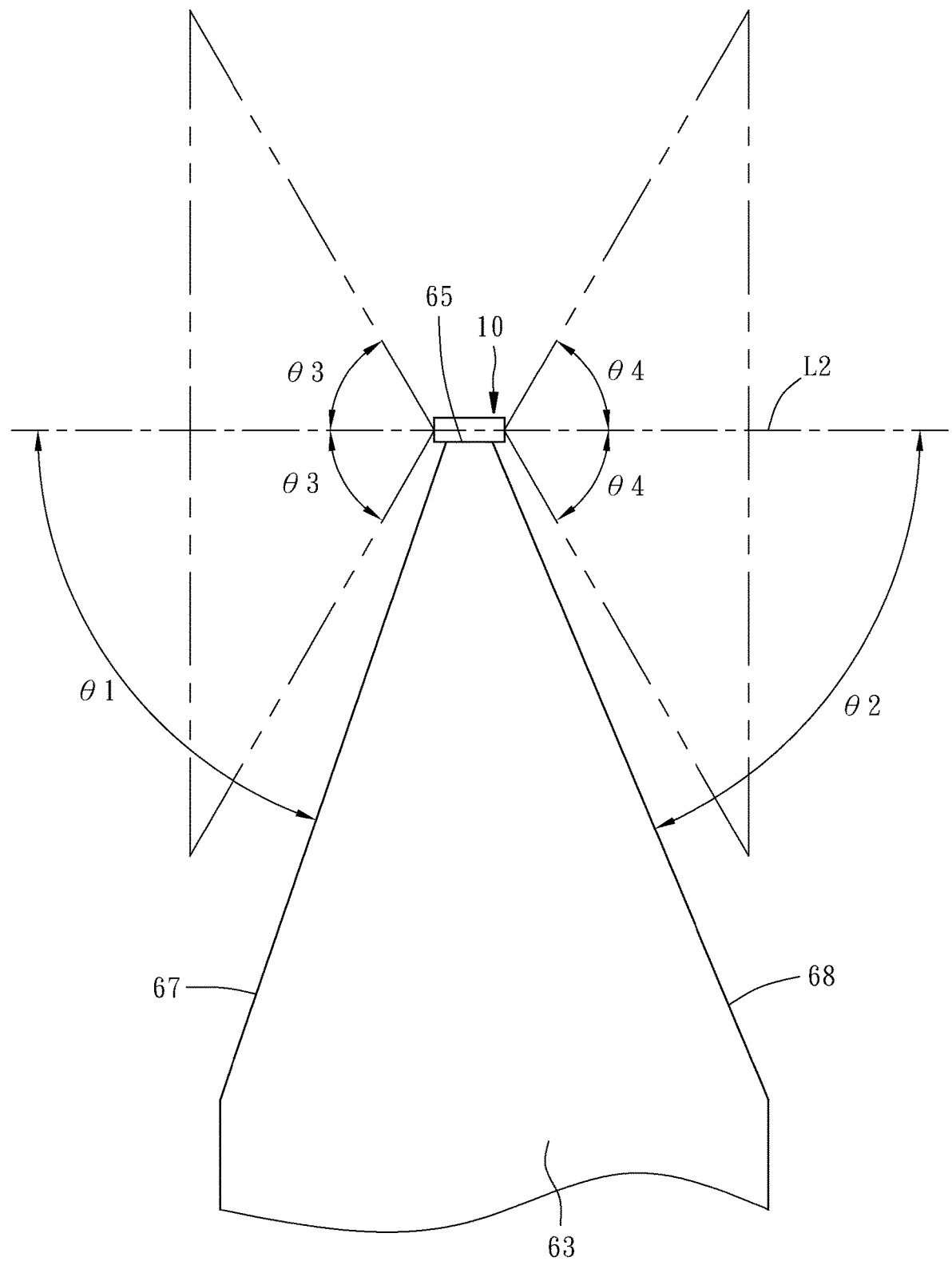
FIGS. 8a-8c are schematic views showing other statuses of the chip under test placed on the chip chuck.
Figure 8B:
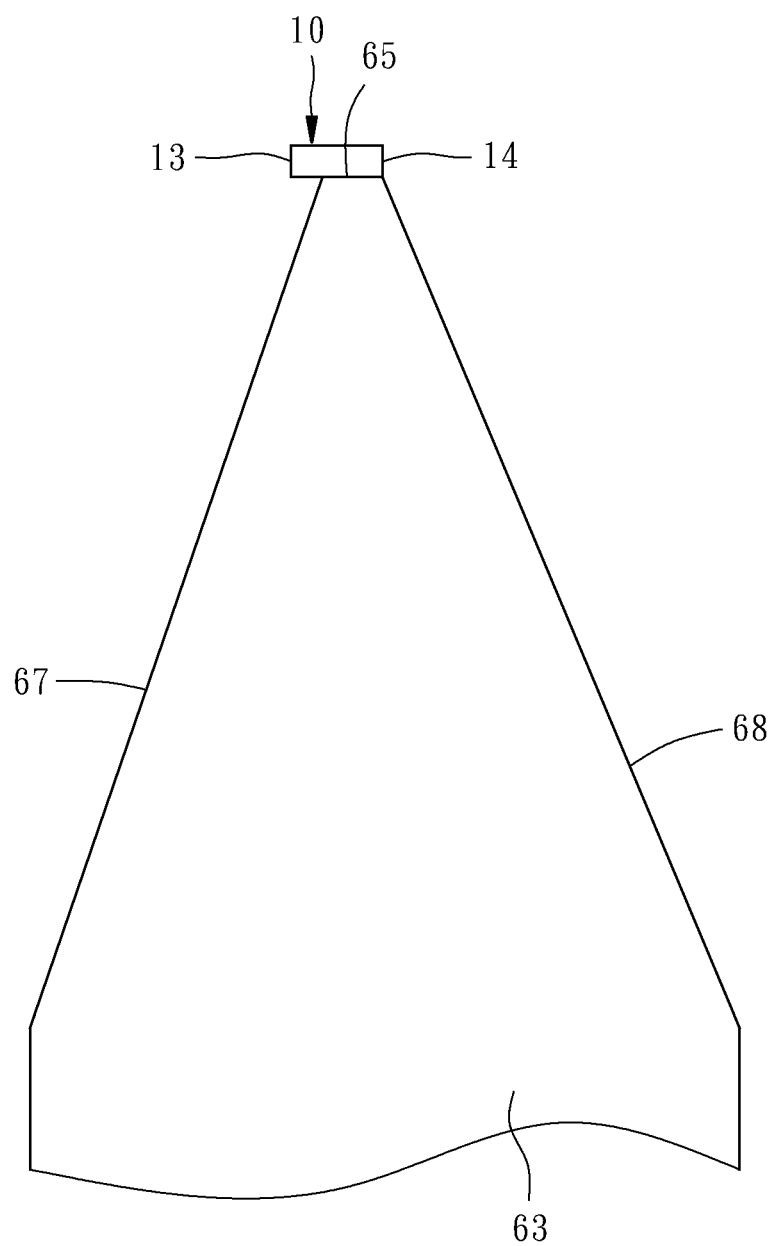
Figure 8C:
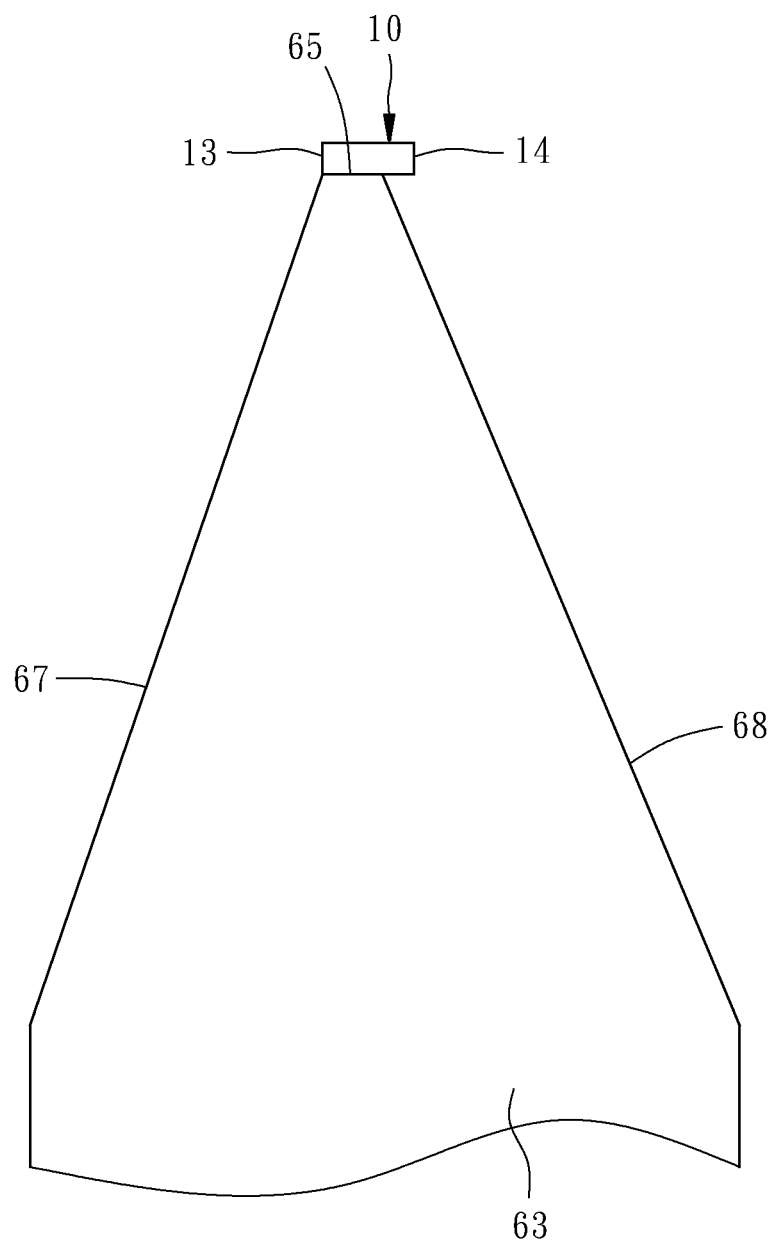

As a result, the chip chuck 60 is adapted for the chip 10 under test to be disposed in the chip placement area 651 of the top surface 65 in a way that two opposite lateral light emitting surfaces of the chip 10 under test, namely the front and back light emitting surfaces 13 and 14 hereinbelow as shown in FIG. 1 and FIGS. 8b and 8c, face toward the front and the back respectively. When the front and back light emitting surfaces 13 and 14 of the chip 10 under test emit light to the front and the back respectively (the scope of luminescence is shown by imaginary lines in FIG. 7 and FIG. 8a), the chip chuck 60 designed with the shape having the front and back slopes 67 and 68 can avoid obstructing the light, or even completely prevent the light from interference with the chip chuck 60. In a condition as shown in FIG. 8a, the chip 10 under test is relatively wider and thereby protrudes out of the front and back slopes 67 and 68, which means the front and back light emitting surfaces 13 and 14 of the chip 10 under test are both not located on the top surface 65 of the chip chuck 60. In such condition, as long as the included angles θ1 and θ2 of the front and back slopes 67 and 68 with respect to the imaginary horizontal reference line L2 are equal to or a little larger than the divergent angles θ3 and θ4 of the light emitted by the front and back light emitting surfaces 13 and 14 of the chip 10 under test, the light is completely prevented from interference with the chip chuck 60. If the chip 10 under test is placed with a positional deviation to the front as shown in FIG. 8b or placed with a positional deviation to the back as shown in FIG. 8c or the chip 10 under test is relatively narrower such as that in this embodiment as shown in FIG. 7, the front light emitting surface 13 and/or back light emitting surface 14 of the chip 10 under test may be located on the top surface 65 of the chip chuck 60. In such conditions, at least one of the included angles θ1 and θ2 of the front and back slopes 67 and 68 with respect to the imaginary horizontal reference line L2 may be designed relatively larger, or at least one of the front and back slopes 67 and 68 may be provided with a groove for light to pass therethrough, such as the groove 672 in this embodiment going to be specified in the following, the light can be completely prevented from interference with the chip chuck 60.

As shown in FIG. 5, the front slope 67 of the chip chuck 60 in this embodiment is provided with a groove 672 connected with the chip placement area 651 of the top surface 65, which means the opening of the groove 672 is partially located on the top surface 65. As shown in FIG. 7, the width of the chip 10 under test is smaller than the width of the top surface 65, and the chip 10 under test is placed on the top surface 65 with a deviation to the back. The included angles θ1 and θ2 of the front and back slopes 67 and 68 with respect to the imaginary horizontal reference line L2 are larger than the divergent angles θ3 and θ4 of the light emitted by the front and back light emitting surfaces 13 and 14 of the chip 10 under test, so that the light emitted by the back light emitting surface 14 is completely prevented from interference with the chip chuck 60 and the light emitted by the front light emitting surface 13 partially passes through the groove 672 and thereby also completely prevented from interference with the chip chuck 60. As a result, the light emitted by the front and back light emitting surfaces 13 and 14 of the chip 10 under test can be completely received by optical sensors for the optical characteristic inspection, that will be specified in the following.

Figure 9:
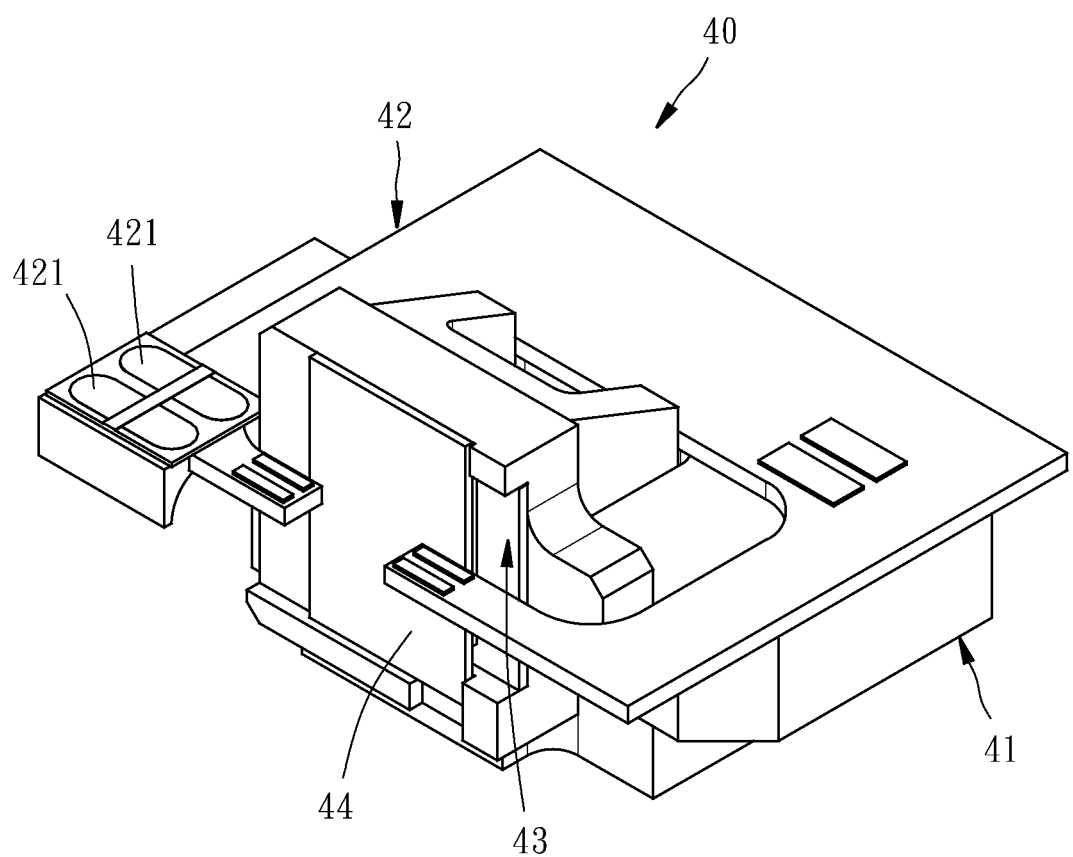
FIG. 9 is an assembled perspective view of the optical sensing module of the chip supporting device.

Referring to FIG. 3 and FIG. 9, the aforementioned bottom plate portion 61 and top plate portion 62 of the chip chuck 60 collectively form a base portion 69 connected with the supporting portion 63. The base portion 69 extends from a position below the back slope 68 in a direction of leaving the front slope 67, i.e., extending to the negative direction of X-axis. The optical sensing module 40 is fixed to the base portion 69. Specifically speaking, the optical sensing module 40 includes an installation seat 41 fixed to the top plate portion 62 of the chip chuck 60, a circuit board 42 fixed to the installation seat 41 and arranged horizontally (parallel to X-Y plane), and an optical sensor 43 and a light transmissible guard plate 44 fixed to the installation seat 41 and arranged vertically (parallel to Y-Z plane). The circuit board 42 includes two external probe contacts 421 electrically connected with the optical sensor 43. The light transmissible guard plate 44 is a plate pervious to light, such as a transparent glass plate. The optical sensor 43 is disposed in the space between the installation seat 41 and the light transmissible guard plate 44. As shown in FIG. 7, the optical sensor 43 has a light receiving surface 431 spacedly located by the back edge 654 of the top surface 65 of the chip chuck 60 and facing toward the light transmissible guard plate 44. The light receiving surface 431 faces toward the back slope 68 of the chip chuck 60 and is perpendicular to the imaginary horizontal reference line L2, i.e., parallel to the imaginary vertical reference line L1. It is to be mentioned that the chip 10 under test is usually attached to a pick and place apparatus (not shown) by vacuum suction to be placed on the top surface 65 of the chip chuck 60. The aforementioned light transmissible guard plate 44 can prevent the optical sensor 43 from being hit by the pick and place apparatus or other members and thereby damaged. Besides, as shown in FIG. 6 and FIG. 7, the back slope 68 of the chip chuck 60 is provided with a recess 682 located correspondingly to the chip placement area 651 for the optical sensing module 40 to be partially located in the recess 682. For example, the light transmissible guard plate 44 of the optical sensing module 40 in this embodiment is partially located in the recess 682, so that the light receiving surface 431 of the optical sensor 43 can be located relatively closer to the chip 10 under test.

As a result, when the chip supporting device 20 is located at an inspection position, two elastic contact members of a probe device (not shown), such as probes, probe the chip 10 under test located on the top surface 65 of the chip chuck 60 to make the front and back light emitting surfaces 13 and 14 thereof emit light for an integrating sphere 70 located at a fixed position outside the chip supporting device 20 as shown in FIG. 7 to receive the light emitted by the front light emitting surface 13 of the chip 10 under test for the optical characteristic inspection. Meanwhile, the optical sensor 43 of the chip supporting device 20 receives the light emitted by the back light emitting surface 14 of the chip 10 under test and converts the light to electrical signal. Two other elastic contact members of the aforementioned probe device probe the external probe contacts 421 of the chip supporting device 20 to transmit the sensing signal of the optical sensor 43, i.e., the aforementioned electrical signal, to an inspection analysis equipment (not shown) for the optical characteristic inspection of the back light emitting surface 14 of the chip 10 under test. The external probe contacts 421 of the chip supporting device 20 may be configured differently in elevation from the probed conductive contacts (not shown) of the chip 10 under test, or may be configured equally in elevation with the aforementioned probed conductive contacts. The perpendicular distance d between the back edge 654 of the top surface 65 of the chip chuck 60 and the light receiving surface 431 of the optical sensor 43 as shown in FIG. 10 is preferably larger than or equal to 0.5 millimeters and smaller than or equal to 5 millimeters for making the optical sensor 43 completely receive the light emitted by the back light emitting surface 14 of the chip 10 under test.

It is to be mentioned that the aforementioned integrating sphere 70 is a conventional optical inspection instrument in the prior art for inspecting light emitting chips. The integrating sphere 70 is schematically shown by only a rectangle in FIG. 7. In practice, the integrating sphere 70 is a sphere relatively larger in volume, so the integrating sphere 70 is usually disposed at a fixed position, and the chip supporting device 20 and the chip 10 under test are moved together by a mechanism such as a turntable to a position for being inspected by the integrating sphere 70. In other words, the integrating sphere 70 and the chip supporting device 20 are displaceable relative to each other. In the space arrangement of the chip supporting device 20 of the present invention, the back side of the chip chuck 60 will be connected with another mechanism, so those skilled in this field should understand that an integrating sphere is impossible to be disposed on the chip chuck 60. In the present invention, the optical sensor 43 relatively smaller in volume, i.e., not integrating sphere, is disposed on the chip chuck 60, so that the optical sensor 43 can be moved together with the chip chuck 60 and the chip 10 under test.

For enabling the optical characteristic inspection of the chip 10 under test under specific temperature conditions, the bottom surface 64 of the chip chuck 60 is disposed on the temperature controller 33. The temperature controller 33 controls the temperature of the chip chuck 60, so as to control the temperature of the chip 10 under test. For example, the temperature controller 33 in this embodiment is a thermoelectric cooler, which is provided therein with a cooling chip (not shown) to generate the cooling effect from the top surface of the temperature controller 33 to lower the temperature of the chip chuck 60, so as to cool down the chip 10 under test and maintain its temperature at a specific low temperature required for the optical characteristic inspection. Besides, the bottom surface, i.e., heat emitting surface, of the temperature controller 33 is disposed on the heat sink 32. The heat sink 32 is made of metal or other materials relatively higher in heat conductivity. The heat sink 32 is provided therein with many passages, and provided on the outer surface thereof with only an air inlet and an air outlet (not shown), for compressed air to enter the heat sink 32 through the air inlet, then be distributed to multiple branches (not shown), and then be collected and exhausted through the air outlet. During the compressed air flows in the above-described path, it generates dissipating effect to the heat emitting surface of the temperature controller 33, thereby making the temperature controller 33 achieve great cooling efficiency.

Figure 11:
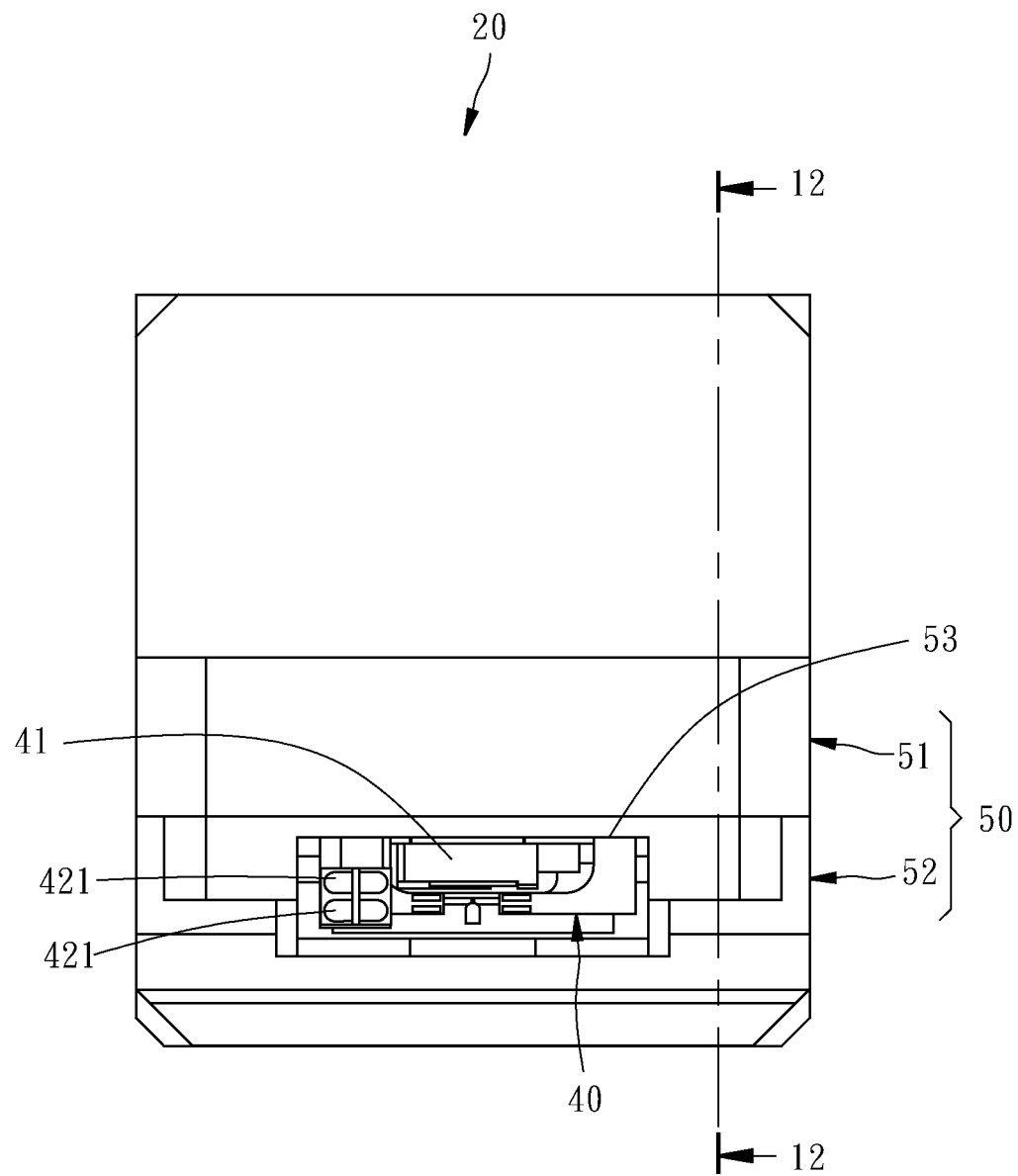
FIG. 11 is a top view of the chip supporting device.
Figure 12:
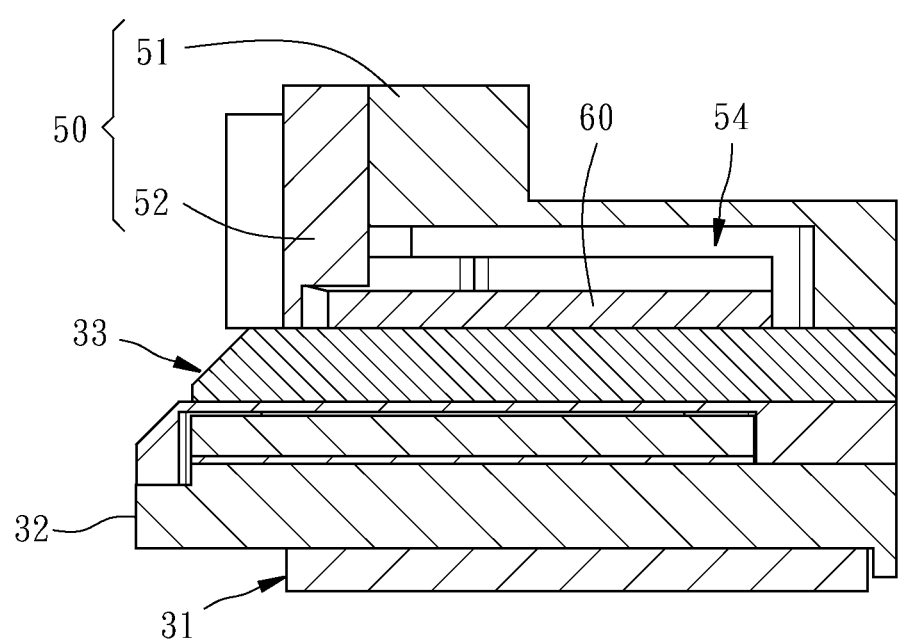
FIG. 12 is a sectional view taken along the line 12-12 in FIG. 11.

In addition, as shown in FIG. 2 and FIG. 3, the shield 50 is disposed on the top surface of the temperature controller 33 and includes a main body 51 and a front cover 52 fixed to the main body 51. The combination of the main body 51, the temperature controller 33 and the front cover 52 is approximately a closed structure, but the front cover 52 is semi-closed and has a top opening 53. Referring to FIG. 11 and FIG. 12, the temperature controller 33 and the shield 50 collectively form an air chamber 54. The chip chuck 60 and the optical sensing module 40 are disposed in the air chamber 54. The shield 50 is adapted for dry air to enter the air chamber 54 through two intake connectors (not shown) and be exhausted through the top opening 53. As a result, when the temperature controller 33 generates the cooling effect, the dry air in the air chamber 54 can prevent the chip 10 under test and the members of the chip supporting device 20 located in air chamber 54 from condensation of moisture due to low temperature.

In conclusion, the chip chuck 60 of the present invention can avoid obstructing the light emitted by the chip 10 under test, thereby causing accurate inspection results. Besides, resulted from the shape design with the front and back slopes 67 and 68, the chip chuck 60 is approximately taper-shaped, thereby stable in structure and having so much volume as to achieve great heat conducting effect when the temperature of the chip 10 under test is adjusted by the temperature controller 33. Besides, the chip supporting device 20 of the present invention enables the optical characteristic inspection of the front and back light emitting surfaces 13 and 14 of the chip 10 under test at the same time and under specific temperature conditions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A chip chuck for supporting a light emitting chip under optical inspection, the chip chuck comprising:
    a top surface having a front edge and a back edge opposite to the front edge;
    a bottom surface opposite to the top surface;
    a front slope obliquely extending from the front edge of the top surface toward the bottom surface; and
    a back slope obliquely extending from the back edge of the top surface toward the bottom surface;
    wherein the top surface includes a chip placement area, on which the light emitting chip under optical inspection is detachably placed;
    wherein the chip chuck is defined with an imaginary vertical reference line perpendicular to the top surface in the chip placement area, and an imaginary horizontal reference line perpendicular to the imaginary vertical reference line;
    wherein the front slope and the back slope are connected with the chip placement area and each provided with an included angle smaller than 90 degrees with respect to the imaginary horizontal reference line.

2. The chip chuck as claimed in claim 1, wherein the included angle is larger than or equal to a divergent angle of light emitted by the light emitting chip under optical inspection.

3. The chip chuck as claimed in claim 1, wherein the top surface is provided with a vacuum suction hole located in the chip placement area for attaching the light emitting chip under optical inspection on the top surface by vacuum suction.

4. The chip chuck as claimed in claim 1, wherein at least one of the front slope and the back slope is provided with a groove connected with the chip placement area of the top surface.

5. The chip chuck as claimed in claim 1, wherein the back slope is provided with a recess located correspondingly to the chip placement area.

6. A chip supporting device comprising:
    a chip chuck as claimed in claim 1; and
    an optical sensing module comprising an optical sensor, the optical sensor having a light receiving surface spacedly located by the back edge of the top surface of the chip chuck in a way that the light receiving surface faces toward the back slope of the chip chuck;
    wherein the light receiving surface of the optical sensor is parallel to the imaginary vertical reference line of the chip chuck.

7. The chip supporting device as claimed in claim 6, wherein a perpendicular distance between the back edge of the top surface of the chip chuck and the light receiving surface of the optical sensor is larger than or equal to 0.5 millimeters and smaller than or equal to 5 millimeters.

8. The chip supporting device as claimed in claim 6, wherein the back slope is provided with a recess located correspondingly to the chip placement area, the optical sensing module is partially located in the recess.

9. The chip supporting device as claimed in claim 6, wherein the chip chuck comprises a base portion and a supporting portion connected with the base portion; the supporting portion comprises the top surface, the front slope and the back slope; the base portion extends from a position below the back slope in a direction of leaving the front slope; the optical sensing module is fixed to the base portion.

10. A chip supporting device comprising:
    a chip chuck comprising a top surface for supporting a chip under test, the top surface having a front edge and a back edge opposite to the front edge, the chip under test having at least one lateral light emitting surface; and
    an optical sensing module comprising an optical sensor, the optical sensor having a light receiving surface spacedly located by one of the front and back edges of the top surface in a way that the light receiving surface faces toward the lateral light emitting surface of the chip under test;
    wherein the chip chuck is defined with an imaginary vertical reference line perpendicular to the top surface;
    wherein the light receiving surface of the optical sensor is parallel to the imaginary vertical reference line of the chip chuck.

11. The chip supporting device as claimed in claim 10, wherein the chip supporting device further comprises a temperature controller; the chip chuck is disposed on the temperature controller in a way that the chip chuck is adjustable in temperature by the temperature controller.

12. The chip supporting device as claimed in claim 11, wherein the chip supporting device further comprises a heat sink; the temperature controller is disposed on the heat sink in a way that the heat sink is capable of dissipating heat of the temperature controller.

13. The chip supporting device as claimed in claim 11, wherein the chip supporting device further comprises a shield disposed on the temperature controller; the temperature controller and the shield collectively form an air chamber for accommodating dry air; the chip chuck and the optical sensing module are disposed in the air chamber.

14. The chip supporting device as claimed in claim 10, wherein the optical sensing module further comprises an external probe contact electrically connected with the optical sensor for outputting sensing signal of the optical sensor.

15. The chip supporting device as claimed in claim 10, wherein the optical sensing module further comprises an installation seat, and a light transmissible guard plate disposed on the installation seat; the optical sensor is disposed between the installation seat and the light transmissible guard plate in a way that the light receiving surface faces toward the light transmissible guard plate.

16. The chip supporting device as claimed in claim 10, wherein the light receiving surface of the optical sensor faces toward the back edge of the top surface; the front edge of the top surface spacedly faces toward an integrating sphere; the integrating sphere and the chip supporting device are displaceable relative to each other.

* * * * *